United States Patent [19]  
Lemke

[11] 3,996,416  
[45] Dec. 7, 1976

[54] INTERCONNECTION SYSTEM AND METHOD OF ASSEMBLY

[75] Inventor: Timothy Allen Lemke, Dillsburg, Pa.

[73] Assignee: AMP Incorporated, Harrisburg, Pa.

[22] Filed: Mar. 18, 1975

[21] Appl. No.: 559,621

[52] U.S. Cl. .............................. 174/68.5; 29/625; 317/101 B
[51] Int. Cl.² ........................................ H05K 3/20
[58] Field of Search ............. 174/68.5, 35 R, 35 C, 174/52 FP; 29/625, 626; 317/101 C, 101 B, 101 CM, 101 CE; 339/17 R

[56] References Cited  
UNITED STATES PATENTS

| 3,134,690 | 5/1964 | Eriksson | 174/68.5 U |
| 3,267,407 | 8/1966 | Humphries et al. | 174/68.5 X |
| 3,296,099 | 1/1967 | Dinella | 174/68.5 X |
| 3,436,604 | 4/1969 | Hyltin et al. | 174/68.5 R |
| 3,659,340 | 5/1972 | Giedd et al. | 174/68.5 X |
| 3,872,236 | 3/1975 | Swengel, Sr. et al. | 174/68.5 |

Primary Examiner—Bruce A. Reynolds  
Attorney, Agent, or Firm—Gerald K. Kita

[57] ABSTRACT

A substrate provided with top and bottom metal clad surfaces is provided with first apertures. The top cladding and the first apertures are protected by a cover film. Insulation covered wires extend across the bottom metal cladding. The ends of the wire are inserted through apertures of the substrate and protrude through the cover. The additional apertures are filled wit sealant and the protruding wire ends are then trimmed to equal lengths protruding above the top metal cladding. The cover is then removed exposin the first apertures and the trimmed wire ends embedded in and strengthened by the sealant. Plating connects the wire ends to the top metal cladding, covers the wires to provide shielding and provides metal linings in the first apertures which linings are connected to the top and bottom layers of cladding. The top metal cladding and the plating thereover are selectively removed providing electrical pads adhered to corresponding wire ends and to corresponding metal linings. In an alternative embodiment pads are provided by plating the wire ends prior to removal of the cover such that pads on the wire ends protrude above the top metal cladding layer. In another alternative embodiment the wire ends are trimmed to the level of the top metal cladding prior to plating.

1 Claim, 13 Drawing Figures

INTERCONNECTION SYSTEM AND METHOD OF ASSEMBLY

RELATED PATENT APPLICATION

The present invention relates to U.S. patent application Ser. No. 314,062, filed Dec. 11, 1972, the disclosure of which is specifically incorporated herein by reference.

BACKGROUND OF THE PRIOR ART

The present invention relates to electrical interconnections for integrated circuit components. Such interconnections have heretofore taken the form of multilayer printed circuit boards and wire soldered to metal lined apertures of the substrate as set forth in U.S. patent application Ser. No. 152,140, filed June 11, 1971 and now U.S. Pat. No. 3,872,236.

SUMMARY OF THE INVENTION

The present invention relates to fabrication of an interconnection system suitable for miniaturization and which is fabricated by automated process or method steps or procedures. The interconnection system is in the form of a substrate having a top surface for carrying integrated circuit components, chips or packages. Lengths of transmission lines extend across a bottom surface of the substrate with the end portions of the transmission lines extending through apertures in the substrate for connection to the connection points or areas of the chips or packages. During fabrication of the substrate sealant material within the apertures anchors the transmission line ends within the substrate and seals the top surface of the substrate from the bottom surface. A removable cover of plastic film overlies and protects the top surface of the substrate while the transmission line ends are trimmed to desired lengths and excess sealant material is removed. The cover is removed to expose the equally protruding transmission line ends which are encapsulated in or embedded in and rigidized or strengthened by the sealant material. Plating is applied to the protruding transmission line ends providing protruding connections for integrated circuit components. Alternatively the exposed transmission line ends are readily trimmed flush with the top surface of the substrate without damaging the substrate to provide electrical connections which are flush with the top surface of the substrate. The top surface of the substrate might be in the form of a clad metal layer in which case the plating must be applied to connect the transmission line ends with the metal clad layer. Subsequent selective removal of the plating and metal layer provides electrical pads on the top surface of the substrate to which the integrated circuit packages are to be connected. The substrate may have a metal clad layer through which the transmission line ends protrude. Plating the transmission line ends and subsequently removing the cover will expose the protruding transmission line ends for connection to integrated circuit packages above the metal layer. Plating the protruding transmission line ends subsequent to removal of the cover permits the exposed protruding wire ends to be plated for connection to the clad metal layer which is subsequently selectively removed to provide electrical pads adhered to the protruding wire ends which are connectable to integrated circuit packages.

Additional plating is provided over the length of transmission lines extending across the bottom surface of the substrate to provide shielding. Apertures unfilled by the sealant may also be plated to provide metal linings extending between the top and bottom surfaces of the substrate. This is particularly desirable when clad metal layers are provided on the top and bottom surfaces of the substrate and are interconnected by the metal linings for electrical grounding purposes. The clad metal layer on the top surface of the substrate may be selectively removed to provide pads connected to the metal linings.

OBJECTS

It is an object of the present invention to provide a transmission line interconnection system utilizing a substrate clad with metal layers.

Another object of the present invention is to provide a transmission line interconnection system and a method for fabricating the same wherein a protective cover is utilized during fabrication to protect a substrate and to protect an optional clad metal layer thereon.

Another object of the present invention is to provide a transmission line interconnection system and method of fabricating the same wherein the transmission line ends are trimmed either to protrude above the surface of a substrate or to be exposed flush with the surface of a substrate.

Other objects and also advantages of the present invention will become apparent from the following detailed description taken in conjunction with the accompanying drawings.

DESCRIPTION OF THE INVENTION

Figure 1:
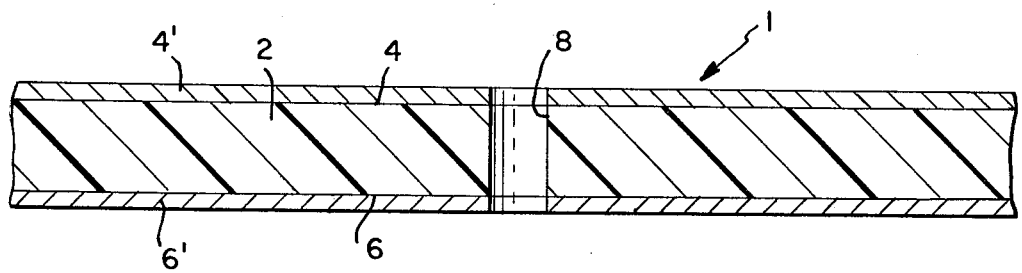
FIG. 1 is an enlarged fragmentary elevation in section of a substrate according to the present invention provided with optional clad metal layers on the top and bottom surfaces thereof and at least one aperture therethrough.
Figure 2:
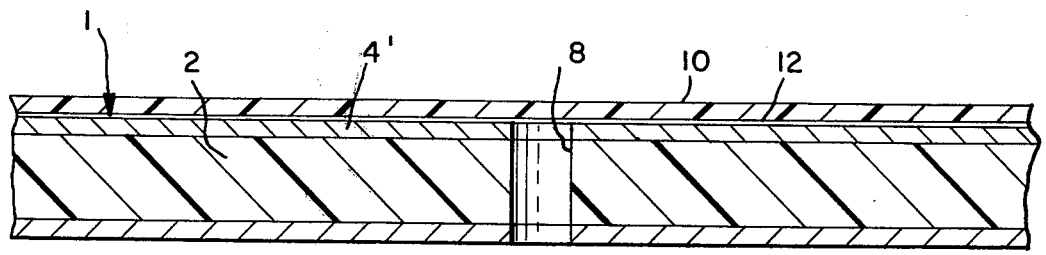
FIG. 2 illustrates the provision of a protective cover on the substrate as shown in FIG. 1.

With more particular reference to FIG. 1 there is illustrated a substrate generally indicated at 1 having a rigid dielectric core 2 with a top surface 4 and a bottom surface 6 provided thereover with corresponding metal layers 4' and 6' which metal layers are permanently affixed to the surfaces 4 and 6 to form clad metal layers. For example the substrate is 0.062 inches thick and the clad metal is 1 mil thick. In the case when the present invention is described in conjunction with clad metal layers, such layers will form the top and bottom surfaces of the substrate. Although not illustrated the metal layers are optional and their elimination will result in the top and bottom layers of a substrate according to the present invention being formed by the surfaces 4 and 6 of the dielectic substrate 2. The present invention further is particularly suited for isolating the top surface from the bottom surface in the finished interconnection system. In some cases however it is desirable to provide a plating lined aperture or apertures through the substrate such that the plating will communicate an electrical ground plane from the bottom surface to the top surface of the substrate. Such an exemplary aperture is illustrated at 8 extending entirely through the substrate and clad metal layers. Although only one aperture 8 is illustrated it is to be understood that a plurality of apertures 8 may be utilized according to the present invention as desired. Providing the apertures in and through the substrate forms the first process step subsequent to providing the clad metal layers on the substrate surfaces 4 and 6. The next process step as illustrated in FIG. 2 comprises assembling a protective cover 10 in the form of a thin film of a suitable material such as metal, plastic and the like. One suitable cover material was found to be a film of MYLAR three mils in thickness. The cover of film 10 is applied to the top surface of the substrate 1 which in this case is the top surface of the clad metal layer 4' by an adhesive 12. The cover or film thus protects the aperture or apertures 8 and the top surface of the substrate 1 during further processing and fabrication of the present invention preferred embodiments.

Figure 3:
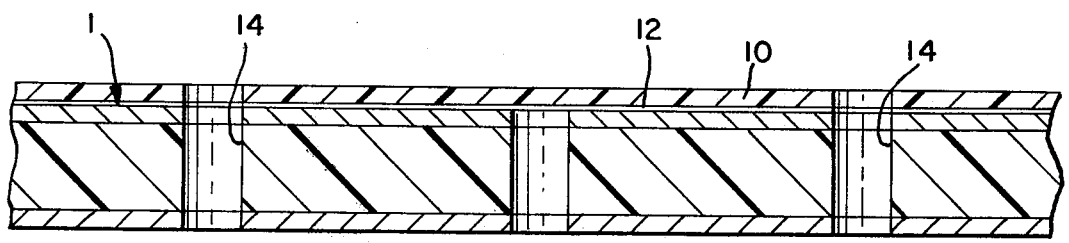
FIG. 3 illustrates the provision of additional apertures through the substrate and through the cover of FIG. 2.
Figure 4:
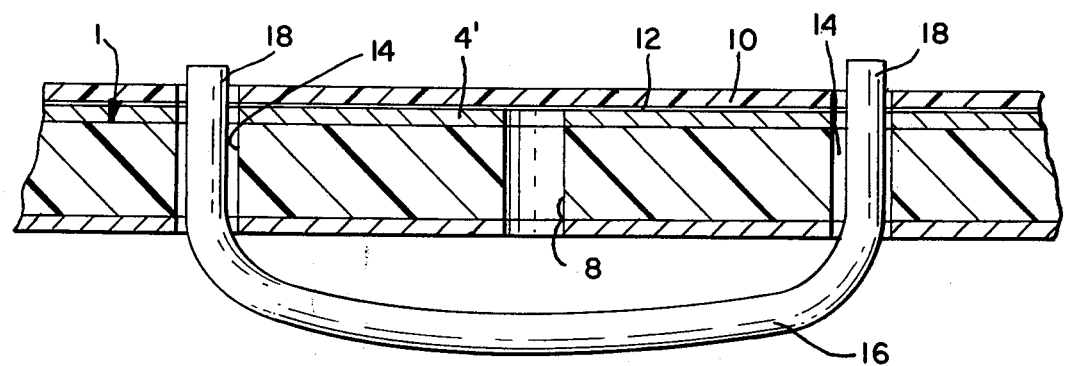
FIG. 4 illustrates the provision of one of a plurality of transmission lines having the free end thereof inserted in corresponding additional apertures to protrude through the cover of FIG. 2.

As shown in FIG. 3 the next process step involves the provision of selected apertures 14 through the substrate 1 the cover 10 and the adhesive layer 12. In FIG. 4 there is illustrated the next process step using a plurality of transmission lines 16 which may be in the form of optical conductors, insulation covered electrical conductors or tubular fluidic conduits. Although only one transmission line is illustrated it is to be understood that a plurality of transmission lines can be utilized in the practice of the present invention. The ends 18 of each transmission line 16 are inserted in and through corresponding apertures 14 to protrude above the top surface of the substrate which surface in this particular illustrated embodiment is formed on the top surface of the clad metal layer 4'. The ends 18 further are shown to protrude above the surface of the film or cover 10 although what is most important is that the ends protrude at least above the top surface of the substrate. More than one end portion 18 may be provided in a single aperture if desired.

Figure 5:
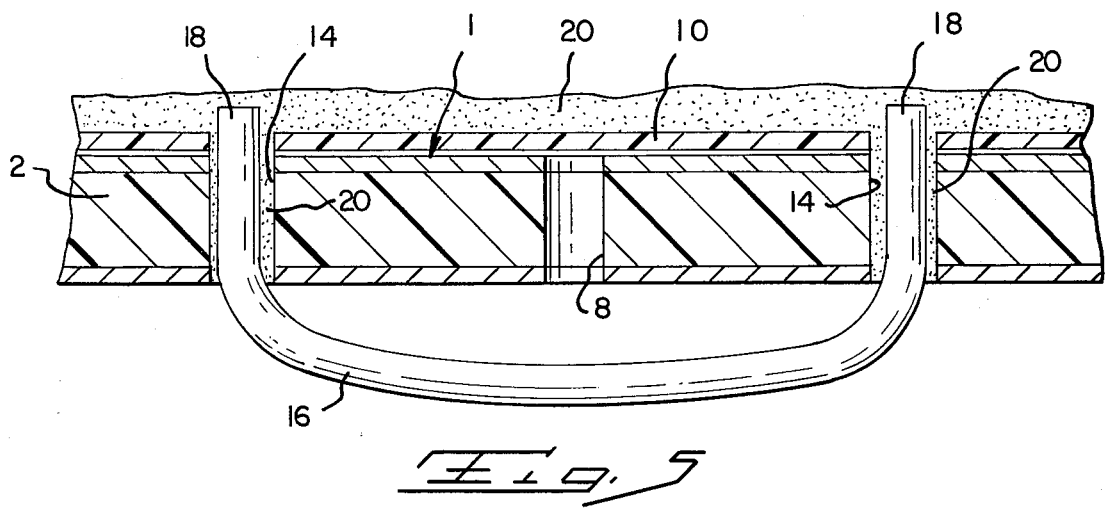
FIG. 5 is a fragmentary enlarged elevation in section illustrating the provision of sealant material in the additional apertures of the substrate as shown in FIG. 4.

FIG. 5 illustrates diagrammatically a further process step whereby the additional apertures 14 are substantially filled with a sealant material 20. More particularly the sealant material fills the clearance between the outer periphery of each end portion 18 and the sidewall of a corresponding additional aperture 14, isolating or sealing the top and bottom surfaces of the substrate from each other.

The sealant 20 may be discretely applied in each aperture 14, for example, by a hypodermic needle to inject the sealant material. However to be consistent with mass production processes the sealant material may be brushed, wiped, sprayed or otherwise deposited over the cover 10 permitting the sealant 22 to be wicked or to be flowed by gravity or applied air pressure into each of the additional apertures 14. The cover 10 accordingly protects the top surface of the substrate 1 as well as the aperture or apertures 8.

Figure 6:
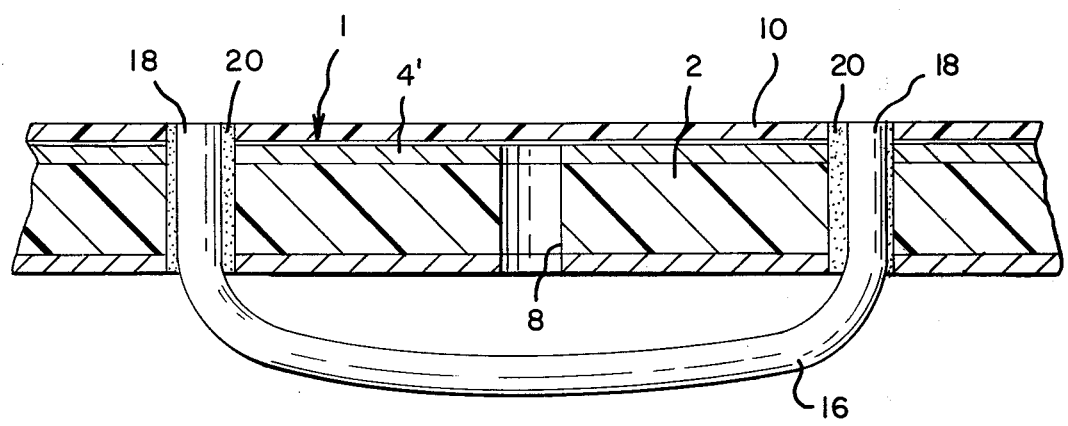
FIG. 6 is an enlarged fragmentary elevation in section illustrating trimming of the transmission line ends to equal protruding lengths and removal of excess sealant material from the cover as shown in FIG. 5.

FIG. 6 illustrates diagrammatically an additional process step whereby the end portions 18 of the transmission lines 16 are trimmed to equal protruding heights above the top surface of the substrate 1. This can be done advantageously by machining the protruding end portions 18 generally flush with the top surface of the cover 10 thereby additionally removing excess sealant material 20 from the cover 10 and also trimming the sealant material 20 flush with the trimmed end portions 18. During machining it is difficult to control the depth of cut. The cover 10 accordingly protects the top surface of the substrate from gouging or other damage. Should variations in the depth of cut occur during machining or trimming the wire ends 18 damage will be limited only to the cover 10.

Figure 7:
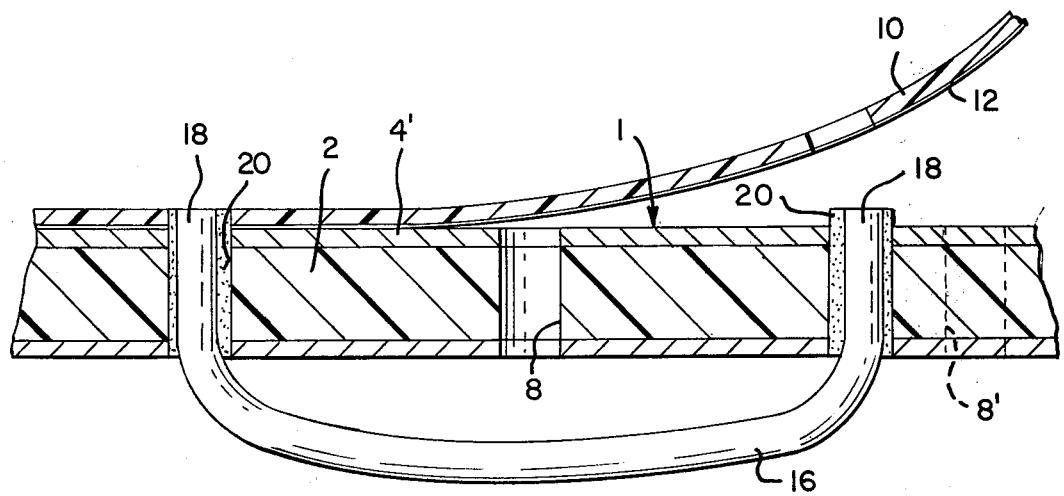
FIG. 7 is an enlarged elevation in section illustrating removal of the cover from the substrate as shown in FIG. 6 and further illustrating in phantom outline the provision of an optional additional aperture to said substrate.

FIG. 7 illustrates that the cover 10 is removed during a further process step according to the present invention. Desirably the adhesive 12 if of the pressure sensitive type will also be removed when the cover 10 is peeled or otherwise removed. However any traces of adhesive 12 remaining on the surface of the substrate 1 can be removed readily by a cleaning process. It is further contemplated that the cover 10 may be inherently adhesive in which case it may be applied to the surface of the substrate 1 without a need for the adhesive 12. Removal of the cover 10 leaves the end portions 18 of the transmission lines 16 protruding equally in height above the top surface of the substrate 1. The end portions 18 accordingly are trimmed and are embedded in or encapsulated in protruding quantities of sealant material 20 taking the form of the additional apertures 14 and reinforcing or strengthening the protruding end portions 18. Where the sealant material 20 is a rigid material such as a curable epoxy the sealant material rigidizes the end portions 18. Where the sealant material 20 is a resilient material such as a curable dielectric plastic or rubber, rigidizing of the end portions 18 is accomplished also but within a resilient projection of sealant material. In the case where the transmission lines 16 are fluidic or optical in nature as described the interconnection system is in usable form with the protruding end portions 18 being readily accessible and, together with the sealant material, providing projecting connections for the transmission lines which may be plugged into or attached to a corresponding optical or fluidic system. In the case where the transmission lines 16 are conduits or optical or insulation covered conductors the aperture or apertures 8 are considered optional and may be either provided or eliminated as desired. In addition at the stage of processing shown in FIG. 7 an additional optional aperture or apertures 8 may be provided through the substrate as shown in phantom outline at 8'. Such additional aperture or apertures 8' are optional and may be either provided or eliminated as desired.

Figure 8:
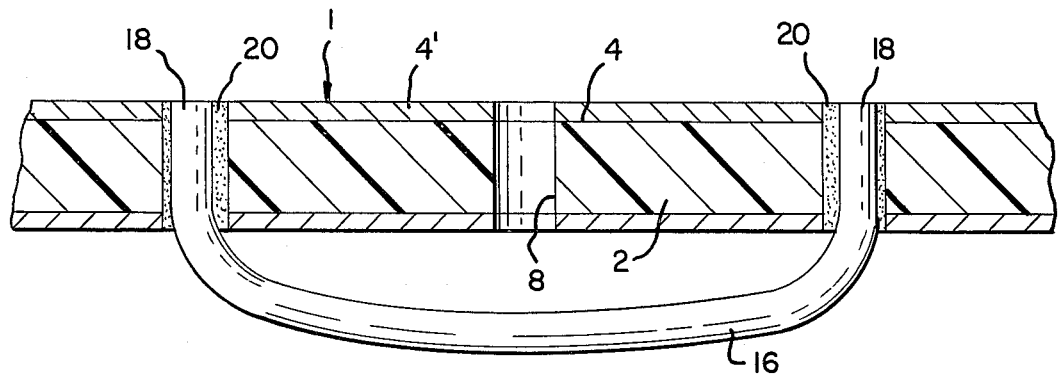
FIG. 8 is an enlarged fragmentary elevation in section illustrating one preferred embodiment of the present invention wherein transmission line ends are flush with the surface of the substrate.

FIG. 8 is illustrative of another preferred embodiment of the present invention as a modification of FIG. 7. As shown in the figure the end portions 18 of the transmission lines are further trimmed flush with the top surface of the substrate 1. With the cover removed the end portions 18 and the encapsulating sealant material 20 are readily removed by sanding with a relatively fine grit abrasive without damaging the top surface of the substrate 1 which is in this case is formed by the top surface of the clad metal layer 4'. In the case where the optional metal layer 4' is not present sanding of the end portions 18 together with encapsulant sealant 20 may yet be accomplished by sanding to the surface 4 of the dielectric material 2. Again the transmission lines 16 may be optical fluidic or insulation covered conductors and are thus in usable form as shown in FIG. 8 when it is desired to connect to the end portions 18 which are made flush with the top surface of the substrate 1.

Figure 9:
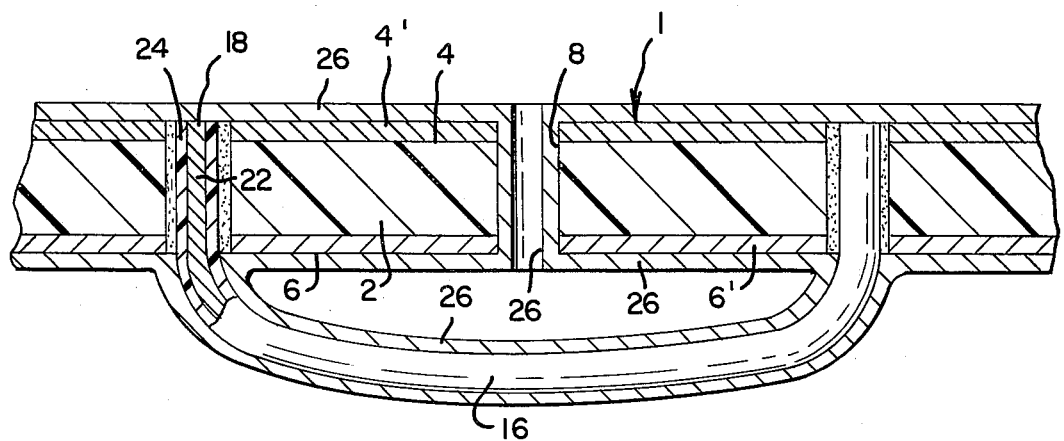
FIG. 9 is a fragmentary enlarged elevation in section illustrating the application of plating providing shielding over the transmission lines, lining for the unfilled apertures and connection of the transmission line ends with the top metal clad layer.

FIG. 9 illustrates a modification of the interconnection system illustrated in FIG. 8. FIG. 9 is particularly directed to a system whereby the transmission lines 16 are electrical conductors 22, for example 40 guage, each individually covered with a layer of insulation 24. With the end portions 18 of the conductors 22 trimmed flush with the top surface of the substrate 1, the entire structure as shown is provided thereover with a layer of plating material. In actual practice the plating layer may be of composite form whereby electroless plating is followed by electrolytic plating according to plating operations well known in the prior art. The metal plating layer 26 accordingly covers the bottom surface of the substrate 1 which in this case is the bottom surface of the clad metal layer 6'. If the optional metal layer 6' is omitted then the plating layer 26 will cover the bottom surface of the dielectric portion 2 of the substrate. In addition the plating material 26 forms an encircling sheath over the transmission lines 16 the surfaces of which may be treated in a well known manner to accept plating providing electrical shielding terminating at the bottom surface of the substrate 1. The metal plating material or layer 26 further provides a lining for each of the apertures 8 joining the lining to each of the optional clad metal layers 2' and 4'. In addition the plating material or layer 26 adheres to the trimmed ends of the end portions 18 thereby joining the trimmed ends of the conductors 22 with the optional clad metal layer 4'. In the case where the clad metal layer 4' is omitted the plating 26 will adhere to the top surface 4 of the dielectric portion 2 as well as to the trimmed ends of the conductors 22.

Figure 10:
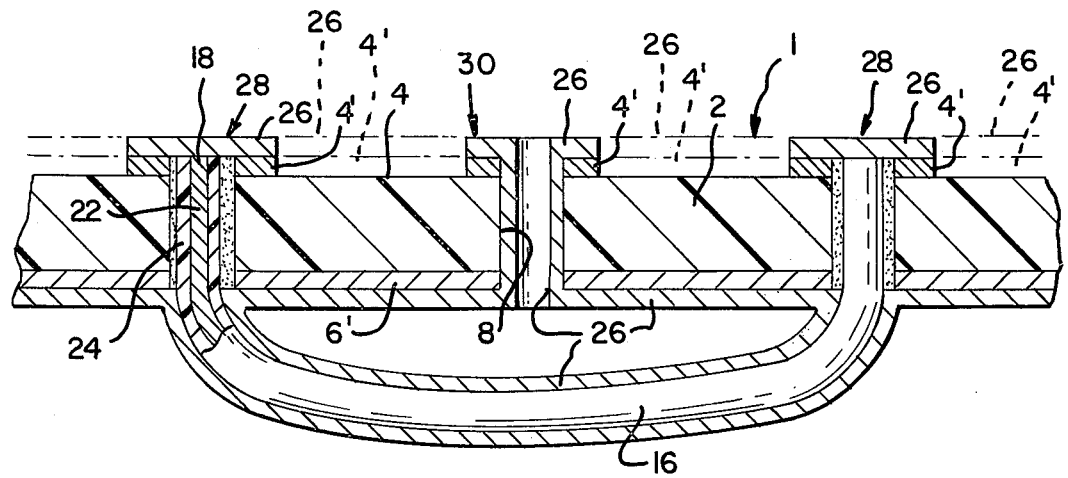
FIG. 10 is an enlarged fragmentary elevation in section illustrating an electrical pad formed by selective removal of the top metal clad layer and the plating thereon.

FIG. 10 illustrates a further process step whereby any well known selective metal removal techniques, for example, photoetching removes portions shown in phantom outline of the metal layers 26 and 4' adhered to the top surface of the substrate to provide electrical pads adhered to and desirably but not necessarily encircling each trimmed end of a conductor 22. Such electrical pads are illustrated at 28 and comprise portions of the metal layers 26 and 4' which remain after selective removal of the metal layers on the top surface of the substrate 1. The top surface of the substrate 1 accordingly is considered to be either the top surface 4 of the dielectric portion 2 or the top surface of the remaining optional clad metal layer 4'. In the case where the clad metal layer 4' is omitted, the electrical pads 28 will be formed directly on the surface 4 of the dielectric portion 2 and the end portions 18 of the conductor will also be trimmed flush with the surface 4 such that the top surface of the substrate 1 will be considered to be the surface 4.

In addition at each aperture 8 a pad 30 is formed on the surface of the substrate 1 comprised of remaining portions of the metal layers 26 and 4' which remain after the selective removal process or processes. Each pad 30 is adhered to the metal lining of a corresponding aperture 8 and desirably but not necessarily encircles the corresponding aperture 8.

Electrical pads 28 are desirably utilized to connect the shielded conductors 28 to the circuitry of an integrate circuit package. Each pad 30 provides an electrical ground connection on the top surface of the substrate which connection is advantageously grounded to the metal layers 26 on the bottom of the substrate and covering the transmission lines 16.

Figure 11:
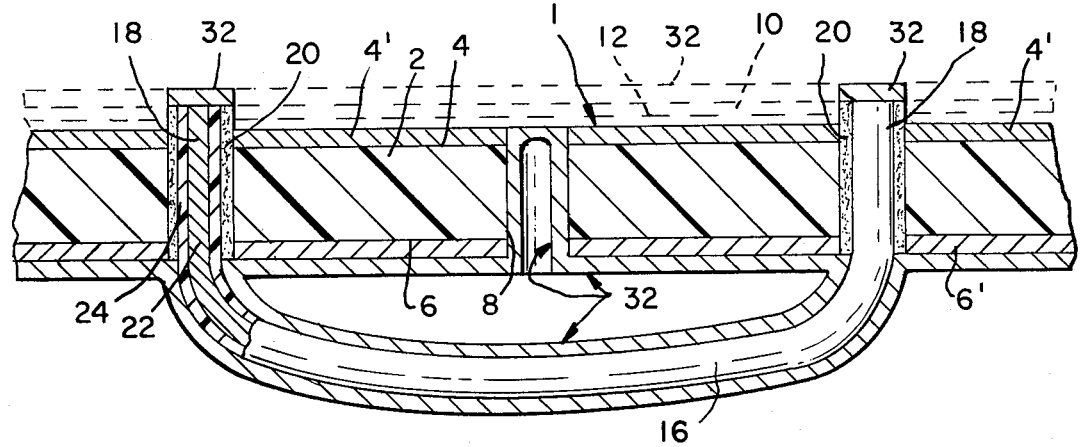
FIG. 11 is an enlarged fragmentary elevation in section illustrating another preferred embodiment of the present invention wherein plating is applied to form shielding on the transmission lines, linings in the unfilled apertures and electrical pads on the ends of the transmission lines, followed by removal of the protective cover leaving the transmission line ends protruding from the top clad metal layer.

As shown in FIG. 11 a modification of the usable form of the invention of FIG. 7 will be described in detail. With reference to the figure, a metal layer or composite metal layer 32 similar to layer 26 is applied by any well known plating process or processes on the structure as illustrated in FIGS. 7 and 11 prior to removal of the cover 10 and the adhesive 12, which adhesive would not be necessary if the cover 10 itself were self adhesive. As shown in FIG. 11 the plating layer 32 adheres to the trimmed ends 18 of the transmission lines 16, which in this case are the end of conductors 22 covered with insulation 24. Also as shown the cover 10 may be of a material such as MYLAR which is resistant to plating and the plating layer 32 therefore is restricted to covering the ends of the conductor 22, its insulation 24 and the encapsulating sealant material 20. In addition the metal layer 32 is adhered to the bottom surface of the substrate 1 which in this case is the bottom surface of the clad metal layer 6'. The metal layer 32 also adheres to the insulation 24 which is treated to accept plating encircling and forming a sheath over the transmission lines 16 to provide shielding which terminates at the bottom surface of the substrate 1. The shielding and plating layer 32 also forms a metal lining in each of the apertures 8 and as shown forms a plated layer or covering for each aperture 8, or not, depending on whether the plating is resistant or not by the adhesive 12. The absence or presence of a covering layer for each aperture 8 is not critical to practicing the present invention. What is important is that the metal lining for each aperture 8 provides an electrical grounding connection from the bottom surface of the substrate to the top surface of the substrate 1. More particularly the metal lining electrically connects the shielding over the transmission lines 16, the metal layer 32 covering the bottom surface of the substrate 1 and the metal clad layer 4' at the top surface of the substrate. When the cover 10 and the adhesive 12, which is provided if the cover 10 is not self adhesive, is removed the end portions 18 of the transmission lines will protrude above the top surface of the substrate 1. The portions of the metal layer 32 adhered to the ends of the conductors 22 form electrical pads which are elevated equal distances above the top surface of the substrate and are electrically isolated from clad metal layers 4'. The transmission line end portions 18 together with the encapsulant material 20 provide electrical connections protruding from the substrate as described in conjunction with the embodiment of FIG. 7.

In the case where the cover 10 utilized in FIG. 11 is not resistant to the application of a plating layer 32, the layer 32 will cover the surface of the cover 10. However when the cover 10 is removed the portions of the plating layer 32 which are adhered to the ends of the conductors 22 will break away and remain as the plating layer which is adhered to the cover 10 is removed. It was heretofore discussed the clad metal layers 4' and 6' are optional in which case the plating layer 32 will be adhered to the surface 6 of the dielectric portion 2 and the metal layer or lining for each of the apertures 8 will terminate at the top surface 4 of the dielectric portion 2 yet sufficiently serve as an electrical ground connection from the bottom surface to the top surface of the substrate.

Figure 12:
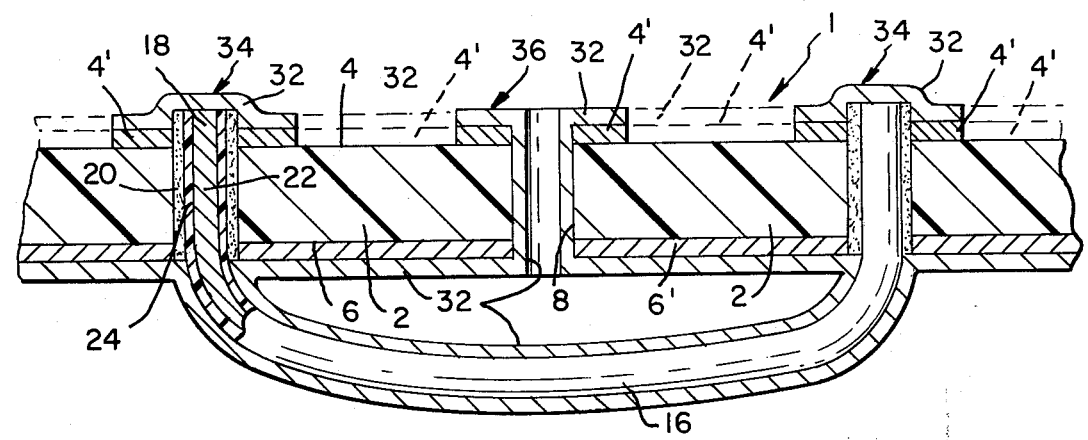
FIG. 12 is an enlarged fragmentary elevation in section illustrating another preferred embodiment of the present invention wherein plating is applied to form shielding for the transmission lines, linings for the unfilled apertures and electrical pads on the ends of the transmission lines protruding from the top surface of the substrate.

FIG. 12 illustrates another preferred embodiment of the present invention which is a modification of the usable form of the interconnection system shown in FIG. 7. With reference to FIG. 12, the plating layer or the composite layer of plating 32 is applied according to well known plating techniques after removal of the cover 10 and adhesive 12 which is provided if the cover 10 is not self adhesive. The plating layer 12 accordingly encircles the lengths of transmission lines 16 to provide electrical shielding terminating at the bottom surface of the substrate 1. The plating layer 32 additionally adheres to and covers the optional clad metal layer 6' and provides a metal lining for each of the apertures 8 which lining joins the optional clad metal layer 6' with the optional clad metal layer 4' to provide an electrical ground connection from the top surface of the substrate to the bottom surface thereof and to the electrical shielding over the transmission lines 16. In addition the plating layer 32 adheres to and covers the optional clad metal layer 4' and adheres to the end portions 18 of the transmission lines 16. More particularly each transmission line 16 is in the form of an electrical conductor 22 covered thereover with a layer treated insulation 24. The plating layer 32 accordingly is adhered to the ends of the conductors 22 and electrically connects the conductors 22 to the clad metal layer 4'. Subsequently selected portions of the plating layer 32 and the optional clad metal layer 4' shown in phantom outline are removed by any well known removal process such as photoetching leaving electrical pads 34 desirably but not necessarily encircling the end portions 18 of the transmission lines and adhered to both the conductor 22 and the dielectric portion 2 of the substrate 1. An additional pad 36 is formed adhered to the metal lining of each aperture 8 and desirably but not necessarily encircling a corresponding aperture 8. The pad 26 also is adhered to the surface 4 of the dielectric portion 2 of the substrate. In the case where the optional clad metal layer 4' is omitted the plating 32 will be adhered directly to the surface 4 of the substrate 2 and also to the surface 6 of the substrate 2.

Figure 13:
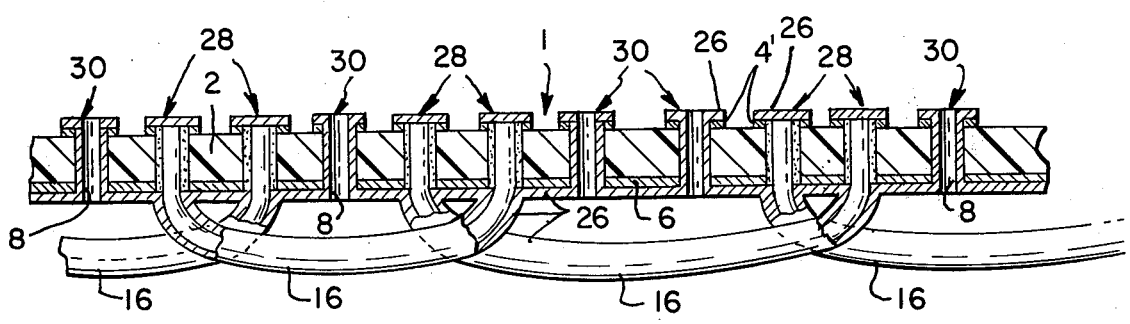
FIG. 13 is an enlarged fragmentary elevation with parts broken away and with parts in section illustrating a plurality of transmission lines to form an interconnection system according to one preferred embodiment of the present invention.

The drawing figures thus far illustrate a single exemplary transmission line 16, although a plurality of transmission lines in each embodiment are consistent with practice of the present invention. FIG. 13 accordingly illustrates more in detail a plurality of transmission lines 16 and plating lined apertures 8 provided on the same substrate 1. FIG. 13 is illustrative of a transmission line interconnection system utilizing a plurality of transmission lines in the form of the embodiment shown in FIG. 10. It is contemplated that each of the other embodiments of the present invention may be provided also with a plurality of transmission lines to form an interconnection system according to the present invention.

Although modifications and preferred embodiments of the present invention are illustrated and described in detail other modifications and embodiments are intended to be covered by the spirit and the scope of the appended claims.

What is claimed is:
1. A system of transmission lines interconnected between spaced locations of a substrate and projecting above a metal layer of the substrate, comprising:
a substrate being clad with first and second metal layers, a plurality of apertures defined through said substrate and said first and second metal layers, a plurality of transmission lines forming loop portions over said first metal layer and having end portions of the transmission lines projecting through corresponding apertures, the end portions of said transmission lines also projecting respectively at selected distances beyond said second metal layer, material solidified in place filling said defined apertures and sealably encircling said end portions of said transmission lines, said material sealing said first metal layer from said second metal layer and rigidifying the end portions of said transmission lines which project beyond said second metal layer, said first metal layer forming discrete electrical pads encircling both the corresponding projecting end portions of said transmission lines and said encircling material, and
metal plating adhered to the projecting ends of said transmission lines and being spaced from and electrically isolated from said second metal layer.

* * * * *